United States Patent
Kim et al.

(10) Patent No.: US 7,046,576 B2
(45) Date of Patent: May 16, 2006

(54) MULTI-PORT MEMORY DEVICE

(75) Inventors: Kyung-Whan Kim, Ichon-shi (KR); Il-Ho Lee, Ichon-shi (KR); Jae-Jin Lee, Ichon-shi (KR)

(73) Assignee: Hynix Semiconductor Inc., (KR)

( * ) Notice: Subject to any disclaimer, the term of this patent is extended or adjusted under 35 U.S.C. 154(b) by 49 days.

(21) Appl. No.: 10/877,888

(22) Filed: Jun. 25, 2004

(65) Prior Publication Data

US 2005/0249020 A1 Nov. 10, 2005

(30) Foreign Application Priority Data

May 10, 2004 (KR) .................. 10-2004-0032651

(51) Int. Cl.
*G11C 8/00* (2006.01)
(52) U.S. Cl. ............ 365/230.05; 365/226; 365/189.09; 327/540
(58) Field of Classification Search ........... 365/230.05, 365/226, 189.09; 327/540
See application file for complete search history.

(56) References Cited

U.S. PATENT DOCUMENTS

| | | | | |
|---|---|---|---|---|
| 5,373,477 A | * | 12/1994 | Sugibayashi | ................ 365/226 |
| 5,856,951 A | * | 1/1999 | Arimoto et al. | ............ 365/226 |
| 6,809,576 B1 | * | 10/2004 | Yamasaki | ................... 327/540 |

* cited by examiner

*Primary Examiner*—Connie C. Yoha
(74) *Attorney, Agent, or Firm*—Blakely Sokoloff Taylor & Zafman

(57) ABSTRACT

A multi-port memory device capable of preventing the first high data failure at an initial data transmission on a global data bus line according to the present invention includes: a global data bus line including a plurality of bus lines; a plurality of data transmitting and receiving unit including transmitters/receivers, which use a current sensing, for exchanging data into the global data bus line, wherein the receiver in the data transmitting and receiving unit includes resistors for dividing a voltage level; and a variable reference voltage generator for generating reference voltage levels as a receiver reference voltage, by controlling the resistance of the resistors in the receiver, wherein the variable reference voltage generator generates a first reference voltage level in an active mode and generates a second reference voltage level in a standby mode and wherein the first reference voltage level is higher than the second reference voltage level.

11 Claims, 14 Drawing Sheets

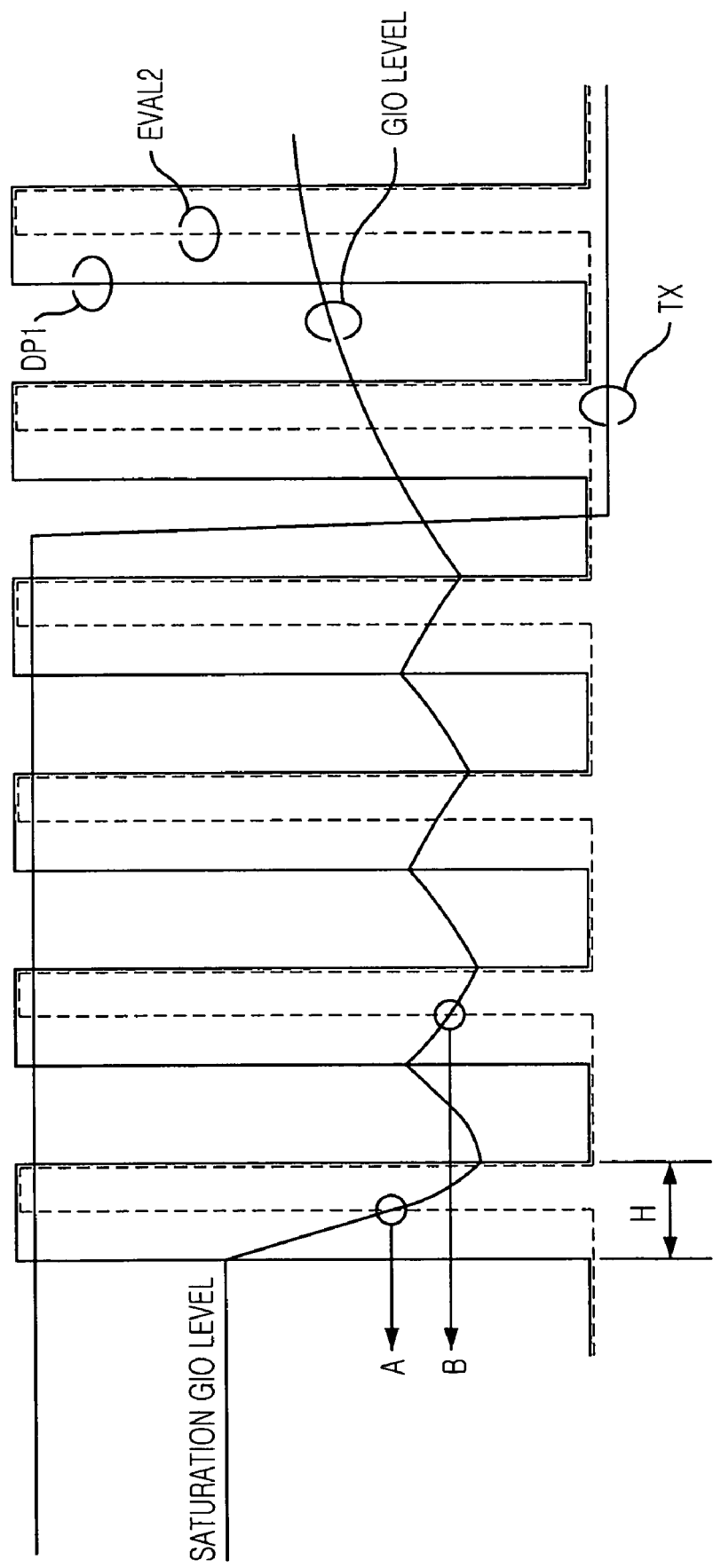

MULTI-PORT MEMORY DEVICE

FIELD OF THE INVENTION

The present invention relates to a semiconductor memory device; and, more particularly, to a multi-port memory device. Further, the present invention relates to a technique for improving initial voltage on a global data bus in the multi-port memory device.

DESCRIPTION OF RELATED ART

Most of the memory devices, such as DRAMs, have one port in which a plurality of input/output pin exists. That is, the memory device has one port for exchanging data with a chip set. However, in recent, a difference between the chip set and the memory is vogue in the meaning and the memory and the chip set have been used as a common language. Accordingly, with the tendency of the unification of the chip set and the memory, multi-port memory devices that are capable of directly exchange the data with a CPU and a graphic device in the peripheral circuits has been needed. By the way, in order to implement this multi-port memory device, it should be accessible to all the memory cells at any port of the multi-port device.

The applicant proposed architecture of a multi-port memory device through a Korean Patent Application No. 2003-92375 filed on Dec. 17, 2003. FIG. 1 is a schematic diagram illustrating a 256M multi-port DRAM architecture described in the Korean Patent Application No. 2003-92375.

Referring to FIG. 1, the proposed 256M multi-port DRAM includes a plurality of memory cells and row decoders RDEC. The core area is divided into four regions, first to fourth quadrants. A plurality of banks bank0 to bank15 is arranged in the direction of the row decoder (left and right in the drawing) in each quadrant. An arbitrator 100 divides the entire area of the memory into two parts, one of which includes the first and third quadrants and the other of which includes the second and fourth quadrants. The arbitrator 100 creates inner command signals, inner address signals and control signals using external command signals and external address signals in order to arbitrate each element in the memory device. A plurality of ports port0 to port7, which respectively and individually communicates with other target devices, is provided at edges of the four quadrants. First to fourth global data bus lines GIO_LU, GIO_RU, GIO_LD and GIO_RD are provided between the banks and the ports in the direction of row within the corresponding quadrant in order to transfer data in parallel. First and second global data bus connection units PR_U and PR_D selectively couple two neighboring global data bus lines to each other. A plurality of transfer buses TB are provided in the direction of column (downward and upward) in order to transmit data from or to the banks and a plurality of transfer bus connection units TG, which are positioned between two banks in the direction of column, selectively couple the two transfer buses TB to each other. A plurality of bus connection units TL are respectively positioned between the corresponding banks and the global data bus lines in the quadrant corresponding to the banks in order to exchange the data between the transfer buses TB and the first to fourth global data bus lines GIO_LU, GIO_RU, GIO_LD and GIO_RD. A plurality of data transfer units QTRX are positioned between the corresponding ports and the global data bus lines GIO_LU, GIO_RU, GIO_LD and GIO_RD in the quadrant corresponding to the ports, respectively, and then exchanges the data between the corresponding ports and the first to fourth global data bus lines GIO_LU, GIO_RU, GIO_LD and GIO_RD.

As shown in FIG. 1, each of sixteen banks bank0 to bank15 includes 16M (8K rows×2K columns) DRAM cells and the row decoder RDEC and further typically includes core circuits, such as a bit line sense amplifier and an equalizer, for reading out data and writing data in a cell. The banks bank0 to bank15 are divided into four groups and each bank group are respectively arranged in the direction of row within the first to fourth quadrants. For example, the four banks bank0, bank2, bank4 and bank6 are positioned within the first quadrant (upper left), the four banks bank8, bank10, bank12 and bank14 are positioned within the second quadrant (upper right), the four banks bank1, bank3, bank5 and bank7 are positioned within the third quadrant (lower left), and the four banks bank9, bank11, bank13 and bank15 are positioned within the fourth quadrant (lower right). Preferably, the row decoder RDEC is arranged to be adjacent to another neighboring row decoder RDEC so that two row decoders are alternatively positioned between two neighboring banks. One page (column) is divided into four segments each of which includes 512 cells.

Further, using the command signals and the address signals which are transferred in type of package, the arbitrator 100 produces: inner command signals, such as an inner activation command signal ACT, an inner nonactivation command signal PCG, an inner read command signal RD and an inner write command signal WD; inner address signals, such as an activation array address signal AAA, a nonactivation array address signal PAA, a read array address signal RAA, a write array address signal WAA, a row address signal RA, a read segment address signal RSA and a write segment address signal WSA; and control signals, such as a transfer gate control signal TGC, a port/pipe register flag signal PRFG, a port/pipe register data driving signal DP and a DRAM core test mode flag signal DTM. Also, the arbitrator 100 controls each of the elements of the memory.

The ports port0 to port7 are positioned at the edges of die and two of them are arranged at the edge of one quadrant. That is, the ports port0 and port2 are positioned in the first quadrant, the ports port4 and por6 are positioned in the second quadrant, the ports port1 and port3 are positioned in the third quadrant, and the ports port5 and port7 are positioned in the fourth quadrant. Each of the ports port0 to port7 supports a serial I/O interface and independently communicates with other target devices, such as a chip set, a graphic chip and so on. In case that the ports port0 to port7 support a serial I/O interface, each of the ports port0 to port7 includes: a plurality of pads for data, address and command signals; pad buffers, such as read and write buffers, for buffering receiving/transmission signals which are transferred on the pads; a decoder for decoding the receiving data; an encoder for encoding data to be transmitted; and a data converter which converts the received serial data into parallel data and also converts the parallel data to be transmitted into serial data.

Also, as shown in FIG. 1, the first to fourth global data bus lines GIO_LU, GIO_RU, GIO_LD and GIO_RD are positioned in the first to fourth quadrants, respectively. All the first to fourth global data bus lines GIO_LU, GIO_RU, GIO_LD and GIO_RD are bi-directional data buses (of 512 bits) which are coupled to the corresponding banks, ports and global data bus connection units PR_U and PR_D.

In addition, the first global data bus line GIO_LU and the second global data bus line GIO_RU can be coupled to each other through the first global data bus connection unit PR_U and the third global data bus line GIO_LD and the fourth global data bus line GIO_RD can be coupled to each other through the second global data bus connection unit PR_D. The first and second global data bus connection units PR_U and PR_D include bi-directional pipe registers corresponding to the 512 global data bus lines.

The transfer bus TB is a local data bus which couples a bit line sense amplifier of each bank to the bus connection unit TL corresponding to the bank. The number of the transfer buses TB is equal to that of cells (for example, 512) which are correspondent to one segment and the transfer bus TB is employed as a differential amplifier bus to sense a voltage difference between two lines.

The transfer bus connection units TG can be implemented by MOS transistors and the number of the MOS transistors may be equal to that of the transfer buses TB. Since the transfer bus (TB) is the differential amplifier bus, the transfer bus connection unit TG includes 512 MOS transistors. Accordingly, the transfer bus connection unit TG is called "transfer gate."

Also, the bus connection unit TL includes sixteen (16) sets each of which has 512 transfer latch circuits. Each transfer latch circuit includes a read bus connection circuit (corresponding to an I/O sense amplifier in DRAM) for a read operation and a write bus connection circuit (corresponding to a write driver in DRAM) for a write operation. The read bus connection circuit includes a read sense amplifier for sensing and latching read data on the transfer bus TB and a read driver for driving the latched data to the global data bus line in the quadrant to which the corresponding bank pertains. The write bus connection circuit includes a write latch circuit for sensing and latching write data on the global data bus line and a write driver for driving the latched data to the transfer bus TB. Further, the data transfer unit QTRX includes 512 transmitters QTx for transferring the write data applied to the corresponding port to the global data bus line and 512 receivers QRx for receiving the read data applied to the global data bus line and transmitting the received data to the corresponding port. Although not shown in FIG. 1, the above-mentioned 256M multi-port DRAM further includes: a voltage generator for generating an inner voltage using an external voltage from an external circuit at the corners of the die; test logic circuits disposed between ports corresponding the first and second quadrants and between the third and fourth quadrants; and a plurality of pads, including a clock pad, which are located at the round edge of the die.

Command lines (ACT, PCG, RD, WD) extended from the arbitrator 100 to the bank and address lines (AAA<0:1>, PAA<0:1>, RAA<0:1>, WAA<0:1>, RA<0:12>, RSA<0:1>, WSA<0:1>) extended from the arbitrator 100 to the bank are provided in each quadrant. Transfer gate control lines (TGC<0:3>) extended from the arbitrator 100 to the transfer bus connection unit TG are provided at the left and right side of the arbitrator 100.

FIG. 2 is a block diagram illustrating the relationship between the segment and the transfer bus TB in the 256M multi-port DRAM of FIG. 1. Referring to FIG. 2, the above-mentioned 256M multi-port DRAM similar to the conventional DRAM includes a plurality of memory cell arrays 200 and bit line sense amplifiers 210. In the memory cell array 200, a pair of transfer buses TB<0> and TBb<0> are coupled to four (4) bit line sense amplifiers BLSA located at upper and lower parts of the memory cell array 200 (dotted box A in FIG. 2). The four (4) bit line sense amplifiers are respectively controlled by the other segment selection signals SGS<0:3> which may be correspondent to column selection signals in the conventional DRAM. Accordingly, in case of 2K columns, if one row and one segment are selected, 512 cells are simultaneously selected and data are exchanged with 512 bit transfer buses TB<0:511>.

Each of the transfer buses TB corresponding to the banks in the first quadrant can be coupled to each of the transfer buses TB in the third quadrant via the transfer gates TG (8 sets in total, one set has 512 transfer gates TG). That is, the transfer gate TG is positioned between the two transfer buses TB which are correspondent to the two banks (hereinafter, referred to as "array") in the same column so that the two transfer buses TG are selectively coupled to each other by the transfer gate TG. A control signal TGC to control the transfer gate TG is produced by the arbitrator 100.

FIG. 3A is a schematic diagram illustrating a normal read path in the 256M multi-port DRAM of FIG. 2 and FIG. 3B is a schematic diagram illustrating a normal write path in the 256M multi-port DRAM of FIG. 2. First, for convenience's sake, the read operation will be described in case that data (512 bits) in a specific segment are read out from the bank bank0 through the port port0.

Referring to FIG. 3A, if a command and address signal, which is related to the read operation, is applied to the port port0 in a type of packet, the arbitrator 100 activates a specific row (word line: WL) by producing the inner activation command signal ACT, the activation array address signal AAA and the row address signal RA of the bank bank0 and then produces the inner read command signal RD, the read array address signal RAA and the read segment address signal RSA of the bank bank0. Accordingly, the bit line sense amplifier BLSA senses and amplifies 512 bit data of the segment which is correspondent to the read segment address signal RSA and transfers the read data to the transfer buses TB and TBb. The bus connection unit TL in the bank bank0 transfers the data on the transfer buses TB and TBb of the bank bank0 to the first global data bus line GIO_LU. The read data on the first global data bus line GIO_LU are stored in a read buffer within the port port0 via the data transfer unit QTRX of the port port0 and the data stored in the read buffer are converted into serial data in a predetermined packet in order to be transmitted to a target device coupled to the port port0. The arbitrator 100 nonactivates the row in the corresponding array by issuing the inner nonactivation command signal PCG and the nonactivation array address signal PAA. At this time, the transfer bus connection unit TG in the corresponding array is turned off so that the transfer buses TB and TBb of the bank bank0 are disconnected to those of the bank bank1. In this drawing, the reference numeral BL (and BLb), T and C denote a pair of bit lines, a cell transistor and a cell capacitor, respectively.

Likewise, for convenience's sake, a write operation will be described in case that data (512 bits) are written in a specific segment of the bank bank0 through the port port0.

Referring to FIG. 3B, if command and address signals and data, which are related to the write operation, are applied to the port port0 in a type of packet, the arbitrator 100 activates a specific row (word line: WL) by producing the inner activation command signal ACT, the activation array address signal AAA and the row address signal RA of the bank bank0 and then produces the inner write command signal WT, the write array address signal WAA and the write segment address signal WSA of the bank bank0. At this time, 512 bit data stored in a write buffer of the port port0 are stored in the segment (having 512 memory cells), which is correspondent to corresponding to the write segment address signal WSA, by the scheduling of the arbitrator 100. The data which are converted into parallel data in the port port0 are loaded on the first global data bus line GIO_LU via the transmitter QTx in the data transfer unit QTRX and are continuously transferred to the transfer buses TB and TBb of the bank bank0 through the bus connection unit TL. The data loaded on the transfer buses TB and TBb of the bank bank0 through are stored in 512 memory cells by the bit line sense amplifier BLSA corresponding to the write segment address signal WSA. Thereafter, the arbitrator 100 nonactivates the corresponding row by producing the inner nonactivation command signal PCG and the nonactivation array address PAA.

FIG. 4A is a schematic diagram illustrating a cross read path in the 256M multi-port DRAM of FIG. 2 and FIG. 4B is a schematic diagram illustrating a cross write path in the 256M multi-port DRAM of FIG. 2. First, for convenience's sake, the cross read operation will be described in case that data (512 bits) in a specific segment are read out from the bank bank0 through the port port1.

Referring to FIG. 4A, the whole operation is similar to the above-mentioned normal operation; however, the transfer bus connection unit TG in the correspondent array is turned on so that the transfer buses TB and TBb in the bank bank0 and the transfer buses TB and TBb in the bank bank1 are coupled to each other within the same array. The data loaded on the transfer buses TB and TBb in the bank bank1 are transferred to the target device via the bus connection unit TL, the third global data bus line GIO_LD, the data transfer unit QTRX corresponding to the port port1, and the port port1.

Likewise, for convenience's sake, a write operation will be described in case that data (512 bits) are written in a specific segment of the bank bank0 through the port port1.

Referring to FIG. 4B, the whole operation is similar to the above-mentioned normal operation; however, the transfer bus connection unit TG in the correspondent array is turned on so that the transfer buses TB and TBb in the bank bank0 and the transfer buses TB and TBb in the bank bank1 are coupled to each other within the same array. The data applied to the port port1 are loaded on the transfer buses TB and TBb in the bank bank0 via the data transfer unit QTRX corresponding to the port port1, the third global data bus line GIO_LD and the bus connection unit TL and the following processes for performing the write operation are the same as the above-mentioned normal operation.

On the other hand, in case that it is necessary to exchange the data between the first global data bus line GIO_LU and the second the global data bus line GIO_RU, the two the global data bus lines are coupled to each other through the first global data bus connection unit PR_U and, in case that it is necessary to exchange the data between the third global data bus line GIO_LD and the fourth the global data bus line GIO_RD, the two the global data bus lines are coupled to each other through the second global data bus connection unit PR_D.

As stated above, since all segments are accessible via each of the ports port0~port7 and it is possible to independently access the segment through the plurality of ports in the multi-port DRAM if the same the global data bus line is not overlapped with other accesses, this architecture makes it possible to provide the multi-access. Further, in a new architecture, it is possible to process 512 bit data in parallel in each quadrant of the core and it is also possible to process the data in series at the ports. Accordingly, the layout area is minimized and the package is also easy to be fabricated. Bandwidth can be increased without a skew between the data bus lines.

FIG. 5 is a schematic diagram illustrating a data transferring structure in the 256M multi-port DRAM of FIG. 1. Referring to FIG. 5, there is provided, in the 256M multi-port DRAM, the global data bus line GIO which makes it possible to exchange the data between the port (I/O interface) and the bank (a memory cell block). Also, there is provided the data transfer unit QTRX for transmitting and receiving the data between the global data bus line GIO and the port and provided the bus connection unit TL for transmitting and receiving the data between the global data bus line GIO and the bank.

FIG. 6 is a schematic diagram illustrating a structure of the global data bus line in the 256M multi-port DRAM of FIG. 1. Referring to FIG. 6, the whole chip has four quadrants Quarter_lu, Quarter_ru, Quarter_ld and Quarter_rd each of which independently works as a DRAM and each of four quadrants Quarter_lu, Quarter_ru, Quarter_ld and Quarter_rd has the same structure. As for the first quadrant Quarter_lu, the four banks, the two ports and the global data bus connection unit PR_U are connected to the global data bus line GIO. That is, seven (7) branches are connected to one line. When one global data bus line GIO is shared with other elements, the load on the global data bus line GIO is very large and a data noise can be generated.

FIG. 7 is a schematic diagram illustrating the worst cases of the read and write operations in the 256M multi-port DRAM of FIG. 1. Referring to FIG. 7, one global data bus line GIO includes 512 bus lines and a plurality of metal wire connections are formed in the vertical and horizontal directions. Typically, in the silicon processes, the vertical wire connections are formed by a first metal layer and the horizontal wire connections are formed by a second metal layer. The reason why this formation of the hierarchical metal wire is used in the silicon process is that the metal wire can be formed with easy under such a hierarchical metal wire structure. Typically, the resistance of the first metal wire connections is higher than that of the second metal wire connections. By the way, as shown in FIG. 7, the first metal wire connections in the vertical direction have large difference in length thereof. As a result, the loading values on each bus line are different from each other.

With the difference between the loading values on each bus line, another loading difference is caused by the data transmission path. For example, when the read or write operation is generated between the port port0 and the bank bank6, the loading value on the global data bus line GIO is the highest because this data transmission path is the longest. However, this data transmission path can be modified by the change of the metal wire connections and the data transmission path between the port port0 and the bank bank6 is not always the worst case.

As mentioned above, the proposed multi-port DRAM has the global data bus line GIO of a large width covering the 512 bits. Comparing with the typical DRAM (DDR2) having the largest bandwidth of 64 global data bus lines, the number of bus lines in this structure of FIG. 7 is very much. In case that the number of global data bus lines is less than 64, the power consumption is not important even if the data transmitted by the global data bus line are under the full swing of the core voltage; however, if that number of global data bus lines exceeds 64, for example, the number is 128, 256 or 512, this has a problem of power consumption in the data transmission. To solve the problem of the power consumption in this wide-bandwidth global data bus line, the applicant of the present invention has proposed "a global data bus transmitting/receiving structure (Korean Patent Application No. 2003-94697 filed on Dec. 22, 2003 now assigned to the Applicant of the present invention)" in which a current sensing method is used instead of the typical voltage driving method.

FIG. 8 is a schematic diagram illustrating a transmitter and a receiver in a data transfer unit QTRX and a bus connection unit TL according to Korean Patent Application No. 2003-94697.

Referring to FIG. 8, a transmitter TX of a bus connection unit TL is coupled to a global data bus line GIO and a ground voltage level VSS in this order and include NMOS transistors N5 and N6 which have gates receiving a data signal TX1 and a data driving pulse DP1, respectively.

A receiver RX of the bus connection unit TL includes: a PMOS transistor P1 in which a source is coupled to voltage supply VDD and a drain and a gate are diode-coupled to each other; a PMOS transistor P2 in which a source is coupled to voltage supply VDD and a drain is coupled to an output node; an NMOS transistor N1 in which a source is coupled to the drain of the PMOS transistor P1, a drain is coupled to a global data bus line GIO, and a reference voltage VR is applied to a gate; an NMOS transistor N2 in which a source is coupled to the drain (output node) of the PMOS transistor P2 and a reference voltage VR is applied to a gate; and an NMOS transistor N9, in which a source is coupled to a drain of the NMOS transistor N2, a drain is coupled to the ground voltage level VSS, and a data evaluation signal EVAL1 is applied to a gate.

On the other had, a transmitter TX of a data transfer unit QTRX is coupled to the global data bus line GIO and a ground voltage level VSS in this order and includes NMOS transistors N7 and N8 which have gates receiving a data signal TX2 and a data driving pulse DP2, respectively.

The receiver QRX of the data transfer unit QTRX includes: a PMOS transistor P3 in which a source is coupled to voltage supply VDD and a drain and a gate are diode-coupled to each other; a PMOS transistor P4 in which a source is coupled to voltage supply VDD and a drain is coupled to an output node; an NMOS transistor N3 in which a source is coupled to the drain of the PMOS transistor P3, a drain is coupled to the global data bus line GIO, and a reference voltage VR is applied to a gate; an NMOS transistor N4 in which a source is coupled to the drain (output node) of the PMOS transistor P4 and a reference voltage VR is applied to a gate; and an NMOS transistor N10, in which a source is coupled to a drain of the NMOS transistor N4, a drain is coupled to the ground voltage level VSS, and a data evaluation signal EVAL2 is applied to a gate.

The global data bus line GIO is actually formed by a long metal wire so that this can be explained as an equivalent circuit having both a resist and a capacitor. The data transmission between the transmitter TX in the bus connection unit TL and the receiver QRX in the data transfer unit QTRX via the global data bus line GIO relates to a read operation and the data transmission between the transmitter QTX in the data transfer unit QTRX and the receiver, RX in the bus connection unit TL via the global data bus line GIO relates to a write operation. This data transmission structure is useful in such a manner that the global data bus line GIO based on the data signals TX1 and TX2, which the transmitters TX and QTX basically transmit, is charged or discharged and a state on the global data bus line GIO at the receivers RX and QRX is sensed.

FIG. 9A is a timing diagram illustrating a normal data transmission in FIG. 8. That is, FIG. 9A explains a data transmission (the read operation) between the transmitter TX in the bus connection unit TL and the receiver QRX in the data transfer unit QTRX based on the architecture in FIG. 8.

The data driving pulse DP1 is in synchronization with a clock signal at the time of the read operation so that it is activated in a high voltage level. The data driving pulse DP1 in a high voltage level makes the dada from the bank applied to the global data bus line GIO. The data evaluation signal EVAL2 is activated in a high voltage level after a predetermined time (timing margin in which the global data bus line GIO can be charged or discharged to a degree) from a point of time that the data driving pulse DP1 is activated in a high voltage level so that the data on the global data bus line GIO is evaluated by the data evaluation signal EVAL2.

First, when the data signal TX1 applied to the transmitter TX in the bus connection unit TL and the data driving pulse DP1 is in a high voltage level, the NMOS transistors N5 and N6 are turned on and the global data bus line GIO is discharged. At this time, the potential at node A2 in the receiver QRX of the data transfer unit QTRX drops below VDD-Vtp (Vtp: threshold voltage of the PMOS transistor), the PMOS transistors P3 and P4 are turned on, and then the output signal DATA2 in the receiver QRX of the data transfer unit QTRX is in a high voltage level. As a result, the logic high-level data are transmitted via the global data bus line GIO.

Since the global data bus line GIO is in a charge state when the data signal TX1 is in a low voltage level and the data driving pulse DP1 is in a high voltage level, the potential at node A2 in the receiver QRX of the data transfer unit QTRX is kept in the charge state and the PMOS transistor P4 can not drive the output terminal strongly in a high voltage level. Subsequently, when the data evaluation signal EVAL2 is in a low voltage level, the NMOS transistor N10 is turned on so that the output signal DATA2 in the receiver QRX of the data transfer unit QTRX is in a low voltage level with the discharge of the output terminal. As a result, the logic low-level data are transmitted via the global data bus line GIO.

Referring to FIG. 9A, the data driving pulse DP1 has four high sections and this means that the data transmissions are carried out four times. That is, the high data transmissions are carried out twice and the low data transmissions are also carried out twice. In addition, when the high data are transferred, a fluctuation can be slightly generated; however, in a normal operation, the output signal DATA2 is not in a low voltage level even if the data evaluation signal EVAL2 is in a high voltage level. Notwithstanding, as shown in FIG. 9B, this fluctuation works as a noise at the initial operation so that the data can be erroneously recognized.

FIG. 10 is a timing diagram illustrating a failure of the first high data. Referring to FIG. 10, if a sufficient time (a few micro seconds) is maintained without the read or write operation, the global data bus line GIO is charged and the potential on the global data bus line GIO continuously increases up to a saturation point. In present invention, this saturation potential is called "saturation GIO level."

Referring again to FIG. 8, the receiver RX in the bus connection unit TL includes the NMOS transistors N1 and N2 having gates to which a reference voltage VR is applied and the receiver QRX in the data transfer unit QTRX includes the NMOS transistors N3 and N4 having gates to which the reference voltage VR is applied. These NMOS transistors N1, N2, N3 and N4 are employed as active loads in which resistance is varied according to the reference voltage VR. These NMOS transistors N1, N2, N3 and N4 control an amount of current on the global data bus line GIO.

An amount of the above-mentioned saturation GIO level is determined by the reference voltage VR. That is, the charges on the global data bus line GIO come from the receivers RX and QRX and the velocity of the charge and discharge on the global data bus line GIO is determined by the NMOS transistors N1 and N3 of which gates receive the reference voltage VR. The NMOS transistors N1 and N3 to which the reference voltage VR is applied are strongly turned on when the global data bus line GIO is discharged and the NMOS transistors N1 and N3 are turned off when the global data bus line GIO is charged and the potential thereof increases up to the VR−Vtn (Vtn: threshold voltage of the NMOS transistor). Since the NMOS transistors N1 and N3 are turned off, the charge operation on the global data bus line GIO is not continued any more. Accordingly, the saturation GIO level goes up with the increase of the reference voltage VR and the saturation GIO level goes down with the decrease of the reference voltage VR.

In the read operation, while the data driving pulse DP1 is in a high voltage level, this saturation GIO level for the data signal TX1 has a difference in the data evaluation of the first high data and the following high data at the time of discharging the global data bus line GIO. That is, the point of time the global data bus line GIO is discharged is the saturation GIO level in the case of the first high data. Accordingly, the discharging condition of the subsequent high data is better than that of the first high data because the point of time the global data bus line GIO is discharged is less than the saturation GIO level. It can be verified by a fact that the voltage level of the global data bus line GIO for the first high data is different from that for the second high data at the time of activating the data evaluation signal EVAL2 in a high voltage level. That is, since the global data bus line GIO is not sufficiently discharged at the time of evaluating the first high data, it is possible to estimate it to be a low voltage level in the receiver QRX of the data transfer unit QTRX.

The discharging time of the global data bus line GIO increases in proportion to the load on the global data bus line GIO so that the more the load on the global data bus line GIO increases, the more the problem of the first high data failure increases. As set fourth above, since the global data bus line GIO has a structure wherein the plurality of data transmitters/receivers blocks (for example, four banks, two ports and one global data bus connection unit PR) shares one global data bus line, the load on the global data bus line GIO may easily increases along the data transfer path and the first high data failure is further getting more serious because the loading of the global data bus line GIO can be susceptibly varied in accordance with the metal wire connections of the global data bus line GIO.

On the other hand, since the charging time of the global data bus line GIO increases with the decrease of the reference voltage VR, the failure of the first high data can be reduced by the decrease of the reference voltage VR; however, this decrease of the reference voltage VR may issue another problem of low data transmission.

SUMMARY OF THE INVENTION

It is, therefore, a primary object of the present invention to provide a multi-port memory device capable of preventing the first high data failure at an initial data transmission on a global data bus line, by using a current sensing without deterioration of a low data transmission.

In accordance with an aspect of the present invention, there is provided a multi-port memory device including: a global data bus line including a plurality of bus lines; a plurality of data transmitting and receiving means including transmitters/receivers, which use a current sensing, for exchanging data into the global data bus line, wherein the receiver in the data transmitting and receiving means includes resistors for dividing a voltage level; and a variable reference voltage generating means for generating reference voltage levels to control current on the global data bus line by controlling the resistance of the resistors in the receiver, wherein the variable reference voltage generating means generates a first reference voltage level in an active mode and a second reference voltage level in a standby mode and wherein the first reference voltage level is different from the second reference voltage level in potential.

In accordance with another aspect the present invention, there is provided a multi-port memory device including: a global data bus line including a plurality of bus lines; a plurality of data transmitting and receiving means including transmitters/receivers, which use a current sensing, for exchanging data into the global data bus line, wherein the receiver in the data transmitting and receiving means includes resistors for dividing a voltage level; and a variable reference voltage generating means for generating reference voltage levels as a receiver reference voltage, which controls current on the global data bus line, by controlling the resistance of the resistors in the receiver, wherein the variable reference voltage generating means generates a first reference voltage level in an active mode and generates a second reference voltage level in a standby mode and wherein the first reference voltage level is higher than the second reference voltage level.

The variable reference voltage generating means includes: a reference voltage generator for a constant reference voltage using a power supply; a level shifter for receiving the constant reference voltage and for generating the first reference voltage level and the second reference voltage level; and a multiplexing means for selectively outputting the first reference voltage level or the second reference voltage level as the receiver reference voltage of the receivers in response to a mode information signal.

The level shifter is coupled to a ground voltage level and includes: a sink NMOS transistor having a gate to which a bias voltage is applied; a first differential input NMOS transistor coupled between the sink NMOS transistor and a first node and having a gate to which the constant voltage is applied; a second differential input NMOS transistor coupled between the sink NMOS transistor and a second node and having a gate to which a feedback reference voltage is applied; a first load PMOS transistor coupled between the first node and the power supply and having a gate to which a voltage level on the second node is applied; a second load PMOS transistor coupled between the second node and the power supply and having a gate to which a voltage level on the second node is applied, wherein the first and second load PMOS transistors forms a current mirror; a driving PMOS transistor coupled between a third node and the power supply and having a gate to which a voltage level on the first node is applied; and a voltage divider coupled between the third node and the ground voltage level and generating the feedback reference voltage, wherein the first reference voltage level is outputted by the third node and the second reference voltage level is outputted by an output terminal of the voltage divider.

The multiplexing means includes: a first transmission gate for selectively outputting the first reference voltage level as the receiver reference voltage VR in response to the mode information signal; and a second transmission gate for selectively outputting the second reference voltage level as the receiver reference voltage in response to the mode information signal.

Preferably, the reference voltage generator is a reference voltage generating circuit in a type of Widlar or band-gap.

The transmitter includes first and second NMOS transistors which are in series coupled to each other between the global data bus line and a ground voltage level and wherein first and second NMOS transistors respectively receive a data signal and a data driving pulse.

The receiver includes: a first PMOS transistor in which a source is coupled to voltage supply and a drain and a gate are diode-coupled to each other; a second PMOS transistor in which a source is coupled to voltage supply and a drain is coupled to an output node; a first NMOS transistor in which a source is coupled to the drain of the first PMOS transistor, a drain is coupled to the global data bus line, and a reference voltage is applied to a gate; a second NMOS transistor in which a source is coupled to the drain (output node) of the second PMOS transistor P2 and a reference voltage is applied to a gate; and a third NMOS transistor, in which a source is coupled to a drain of the second NMOS transistor, a drain is coupled to the ground voltage level, and a data evaluation signal is applied to a gate.

In the multi-port memory device including a data transmission structure of a current mirror which is used to exchange between the data on the global data bud line and the data transmitting/receiving blocks (bank, port, data bus connection unit), the present invention variably produces the reference voltage according to the operation modes. The present invention keeps the reference voltage in a normally high level in the active mode of the memory and reduces the saturation GIO level by changing the reference voltage in the standby mode of the memory. Accordingly, the present invention prevents the failure of the first high data at the time of the transition from the standby mode transitions to the active mode and also prevents the low data sensing error in the active mode.

BRIEF DESCRIPTION OF THE DRAWINGS

The above and other objects and features of the present invention will become apparent from the following description of preferred embodiments given in conjunction with the accompanying drawings, in which:

FIG. 10 is a timing diagram illustrating the failure of the first high data;

DETAILED DESCRIPTION OF THE PREFERRED EMBODIMENTS

Hereinafter, with reference to the accompanying drawings, a preferred embodiment of the present invention will be explained in detail.

Figure 1:
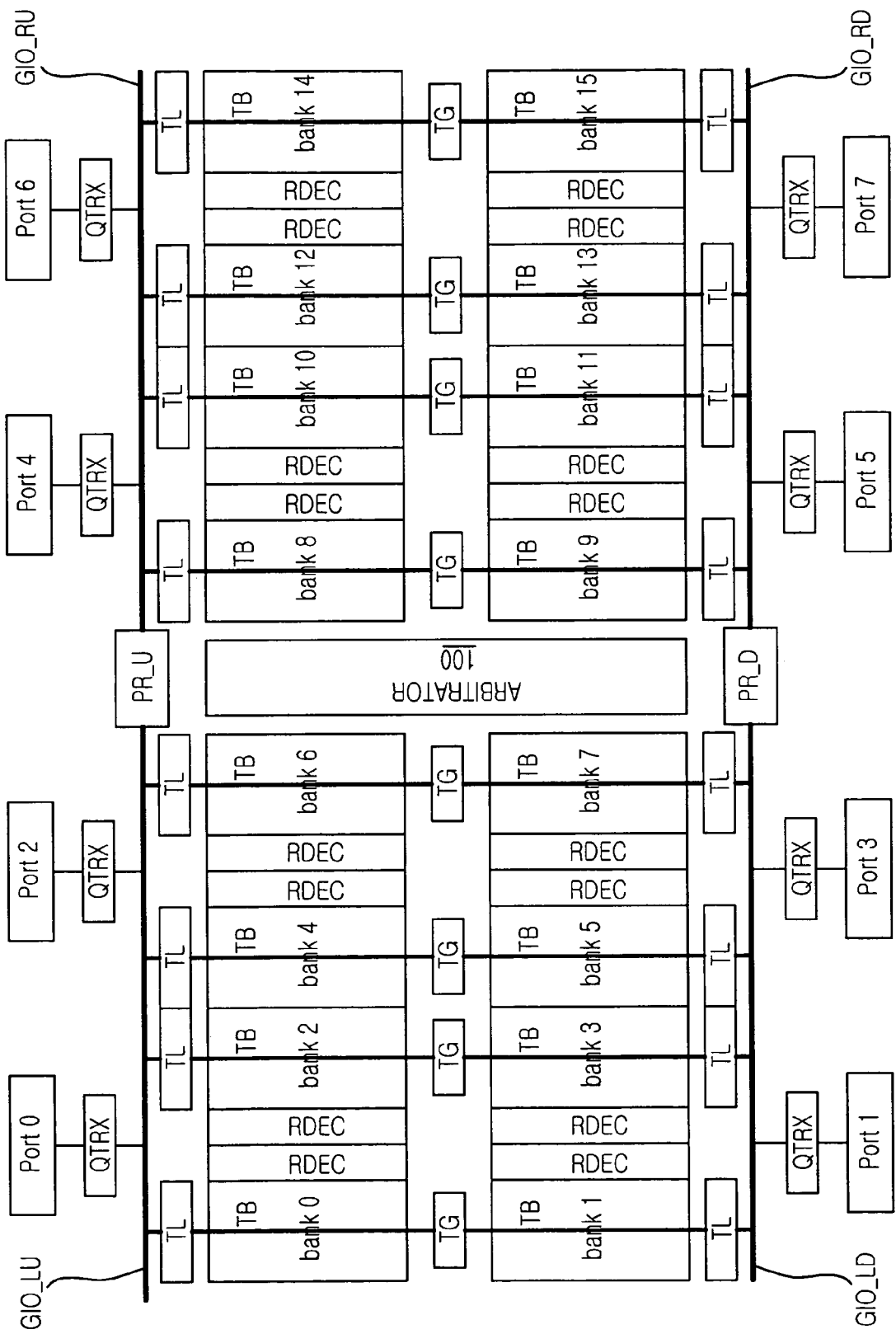
FIG. 1 is a schematic diagram illustrating a 256M multi-port DRAM architecture described in the Korean Patent Application No. 2003-92375.
Figure 2:
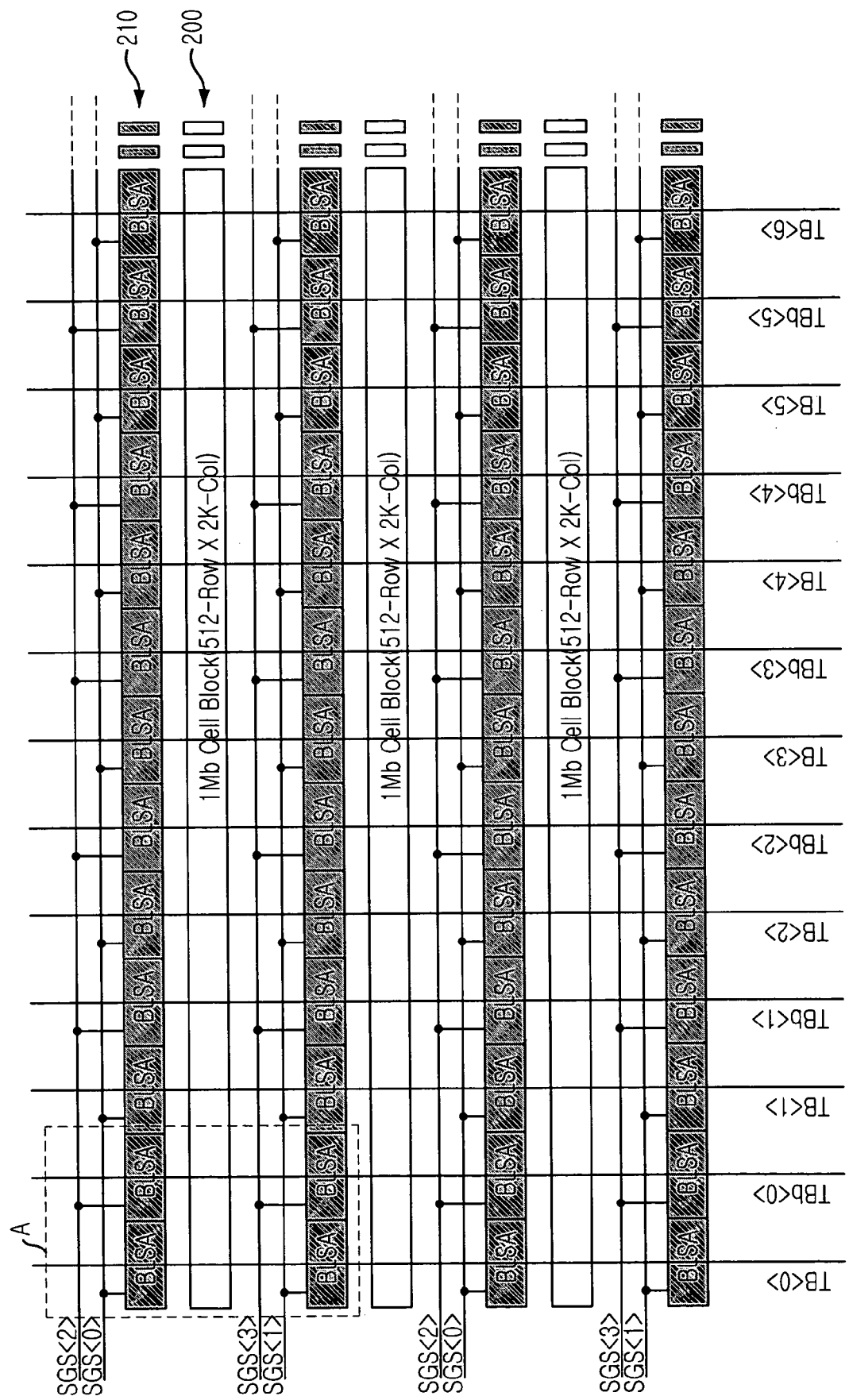
FIG. 2 is a block diagram illustrating the relationship between the segment and the transfer bus TB in the 256M multi-port DRAM of FIG. 1.
Figure 3A:
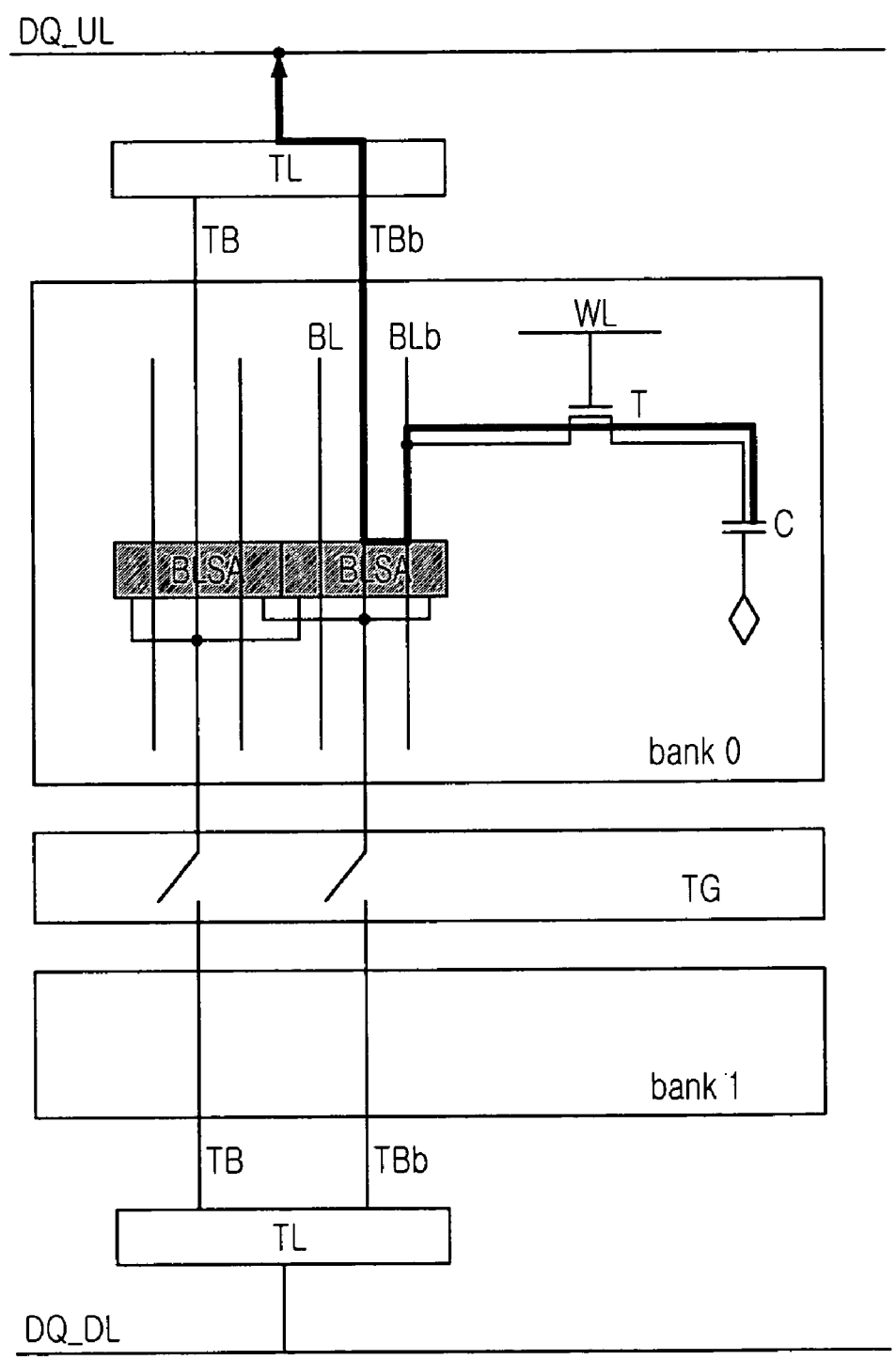
FIG. 3A is a schematic diagram illustrating the normal read path in the 256M multi-port DRAM of FIG. 2.
Figure 3B:
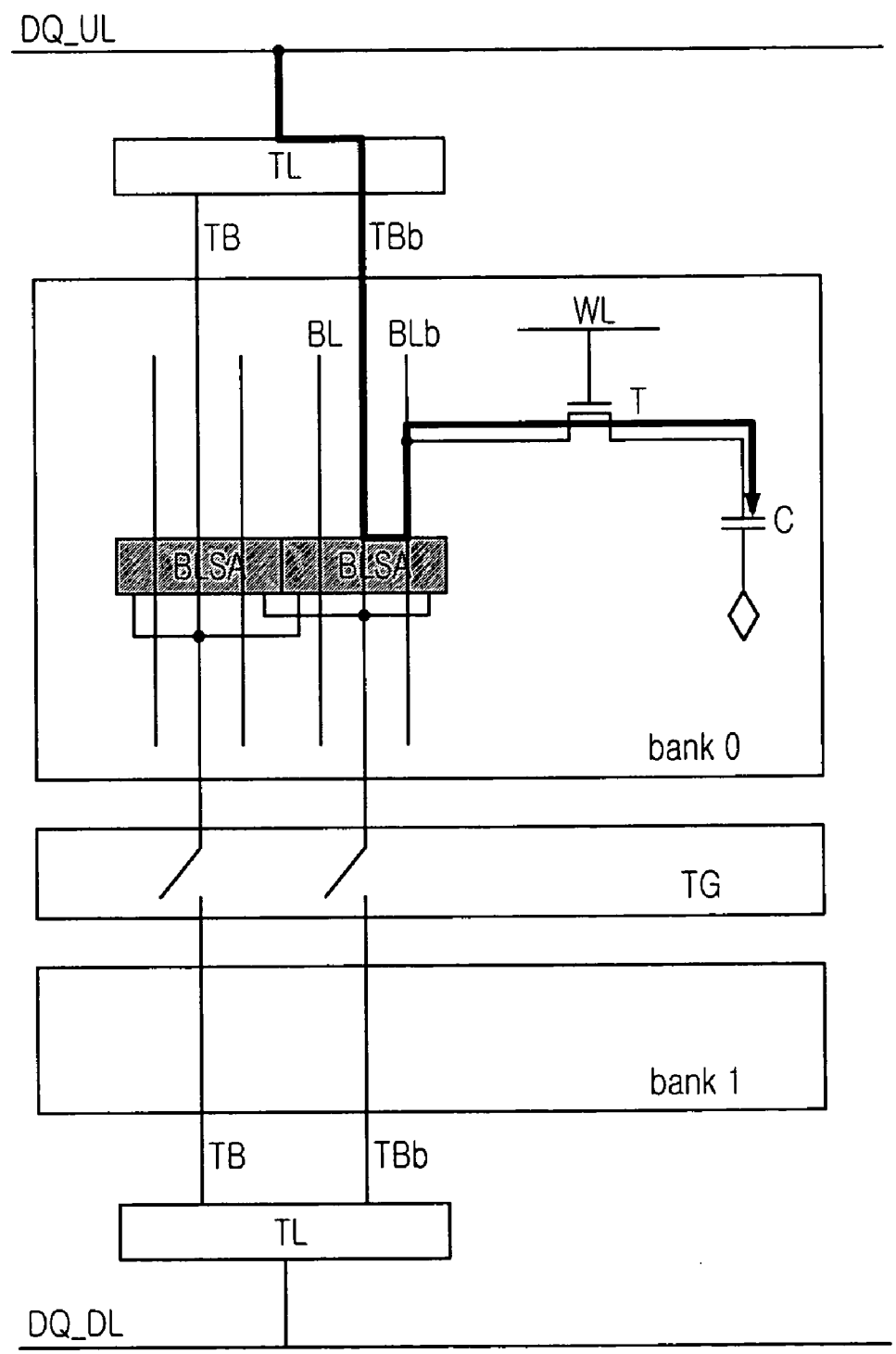
FIG. 3B is a schematic diagram illustrating the normal write path in the 256M multi-port DRAM of FIG. 2.
Figure 4A:
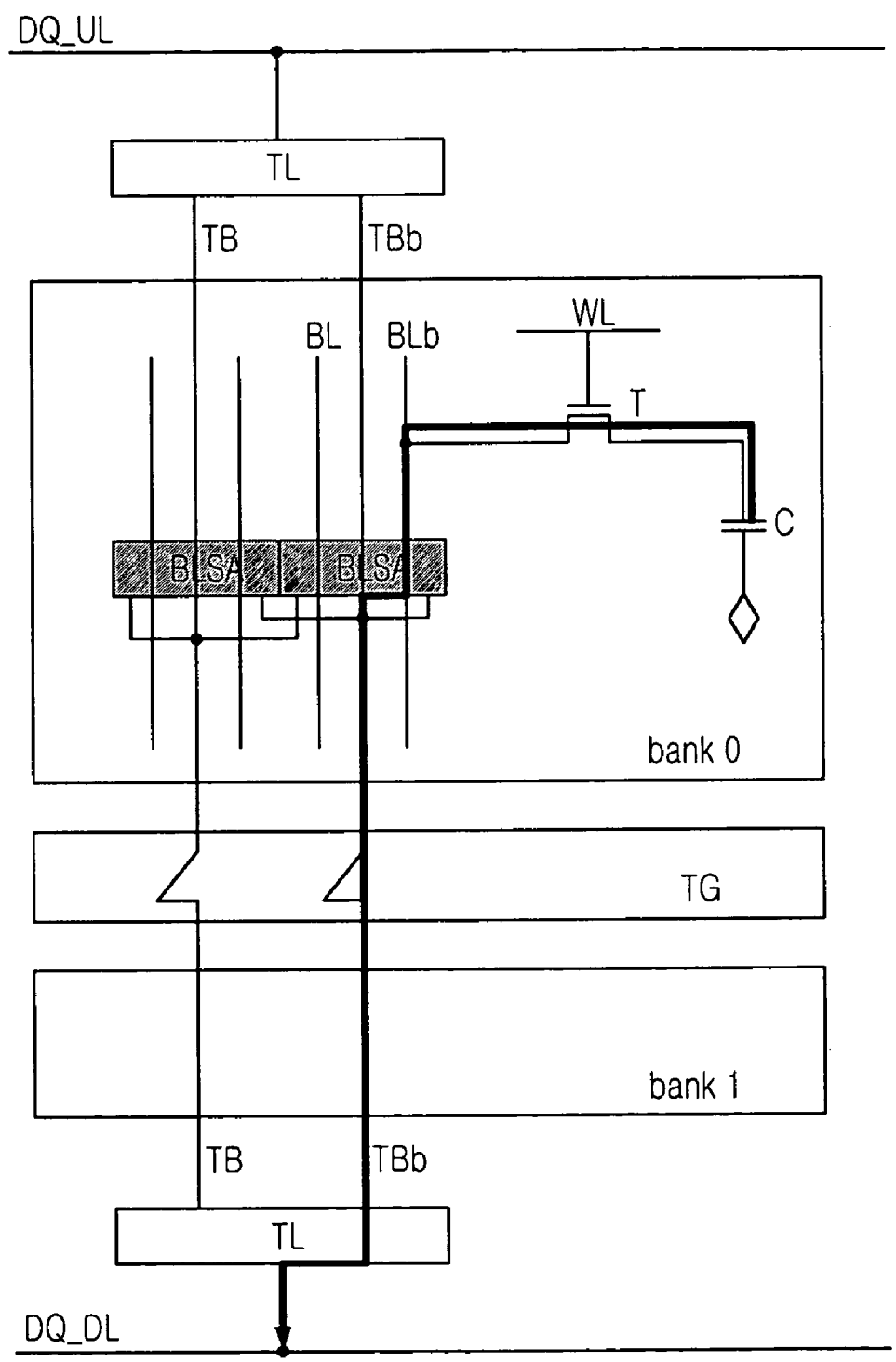
FIG. 4A is a schematic diagram illustrating the cross read path in the 256M multi-port DRAM of FIG. 2.
Figure 4B:
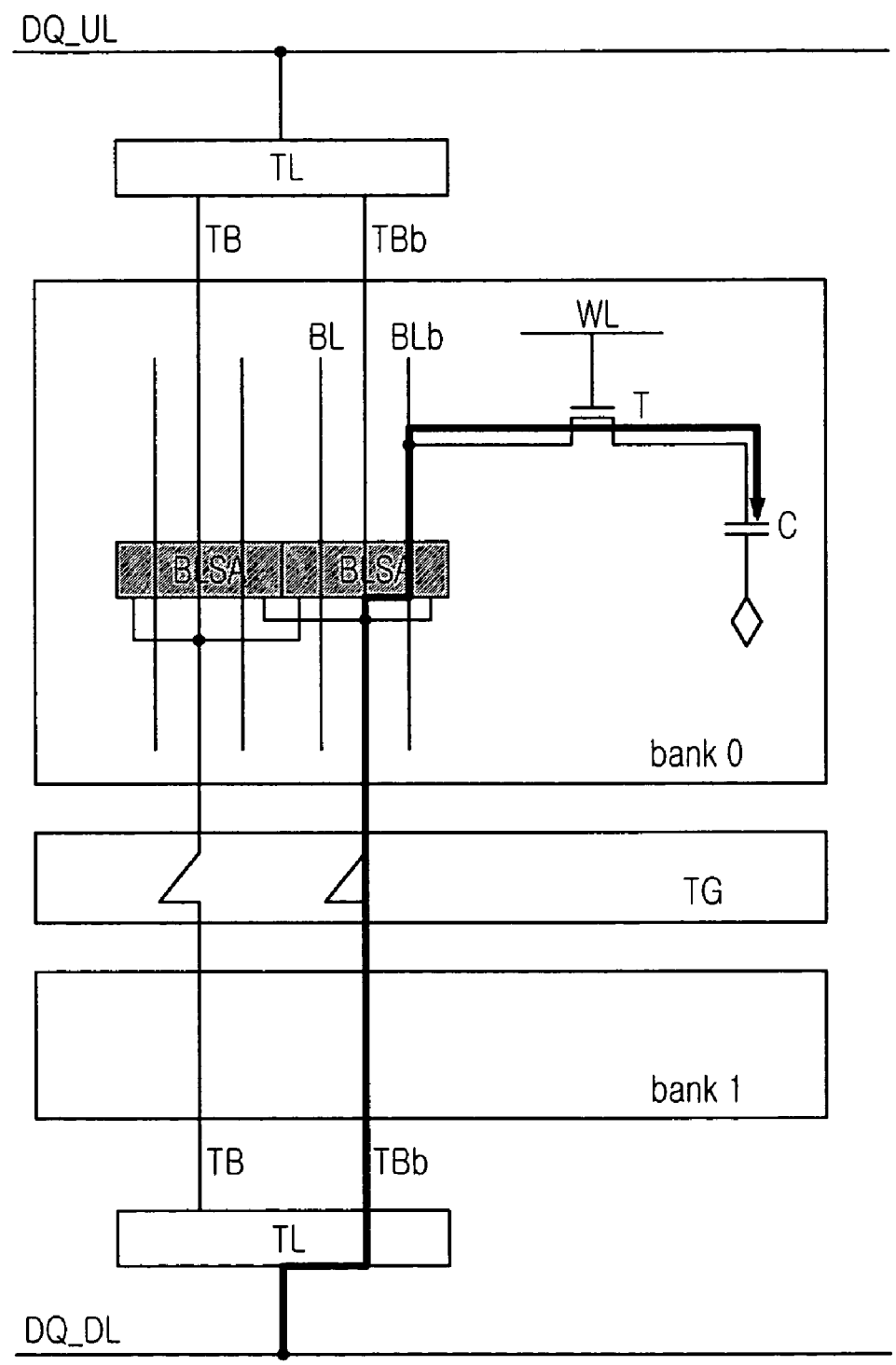
FIG. 4B is a schematic diagram illustrating the cross write path in the 256M multi-port DRAM of FIG. 2.
Figure 5:
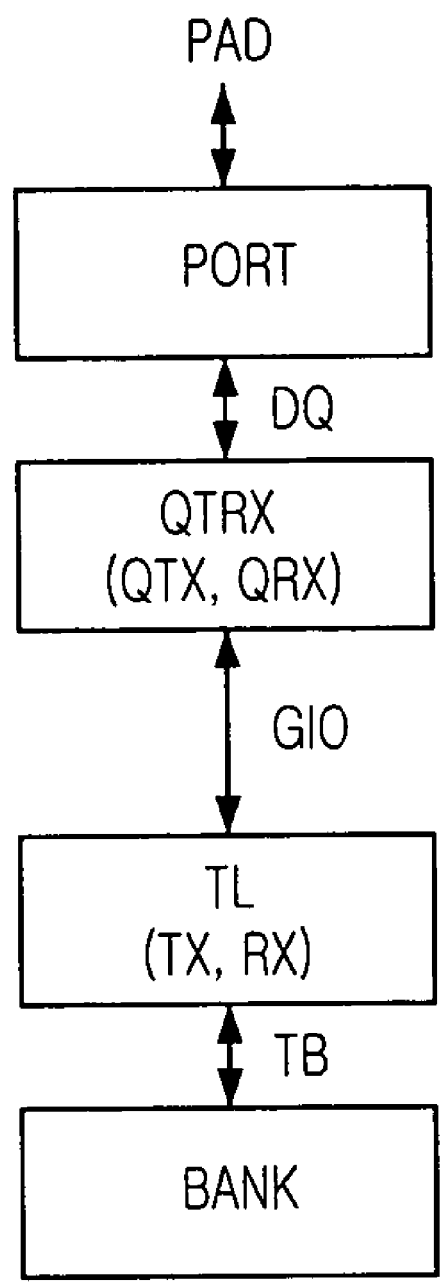
FIG. 5 is a schematic diagram illustrating the data transferring structure in the 256M multi-port DRAM of FIG. 1.
Figure 6:
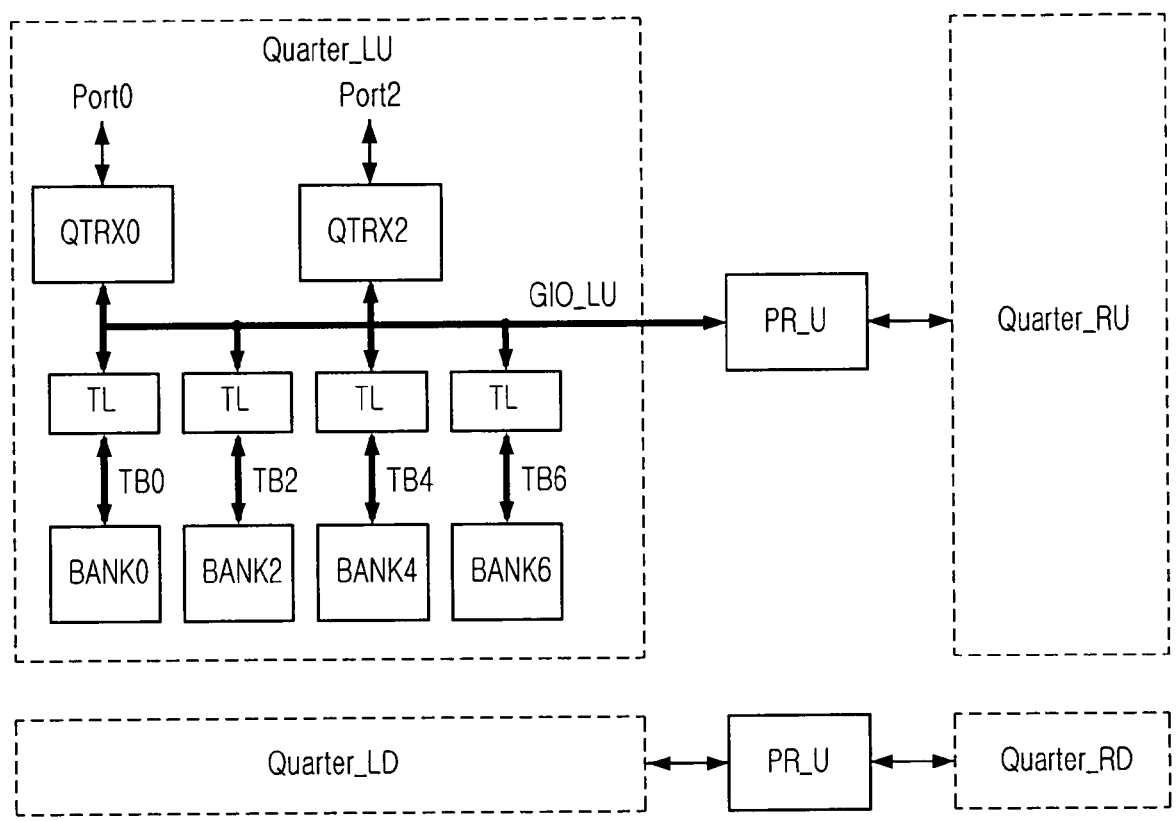
FIG. 6 is a schematic diagram illustrating the global data bus line in the 256M multi-port DRAM of FIG. 1.
Figure 7:
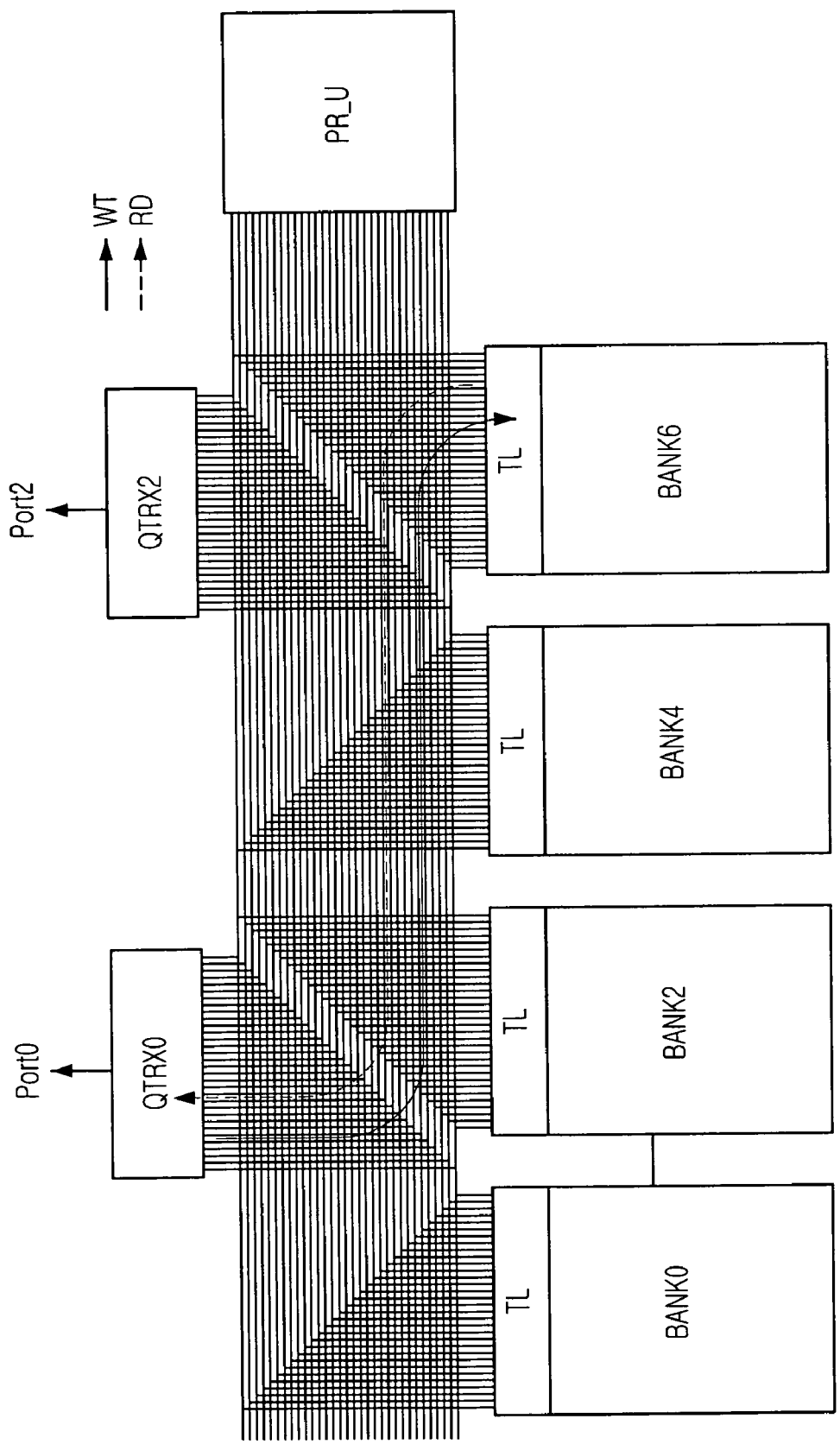
FIG. 7 is a schematic diagram illustrating the worst cases of read and write operations in the 256M multi-port DRAM of FIG. 1.
Figure 8:
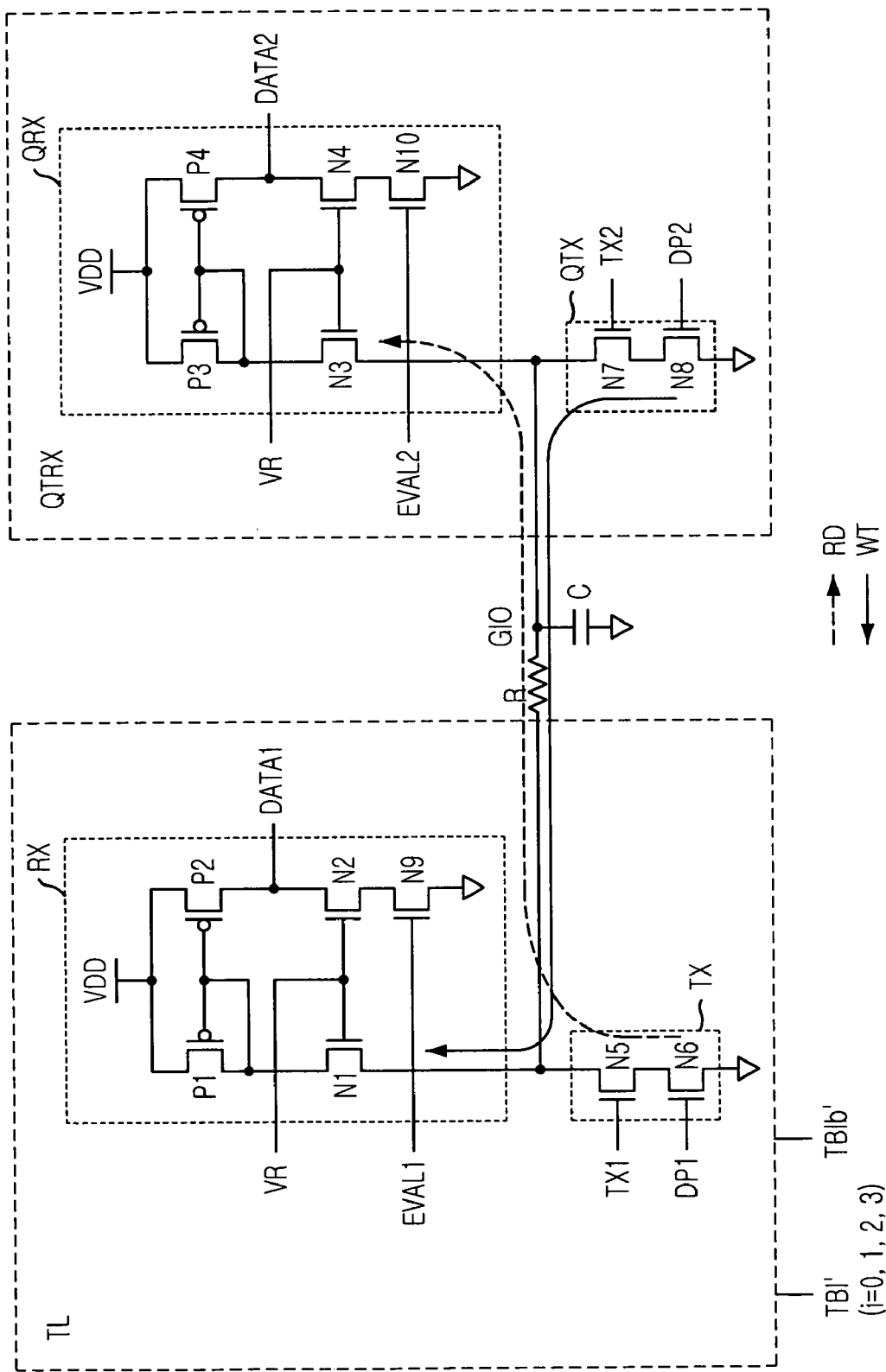
FIG. 8 is a schematic diagram illustrating a transmitter and a receiver in a data transfer unit QTRX and a bus connection unit TL according to Korean Patent Application No. 2003-94697.
Figure 9A:
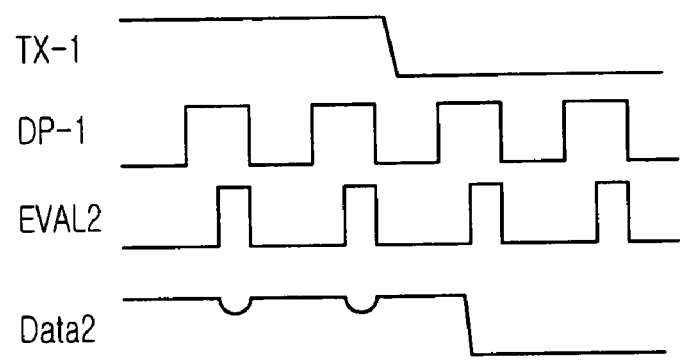
FIG. 9A is a timing diagram illustrating the normal data transmission in FIG. 8.
Figure 9B:
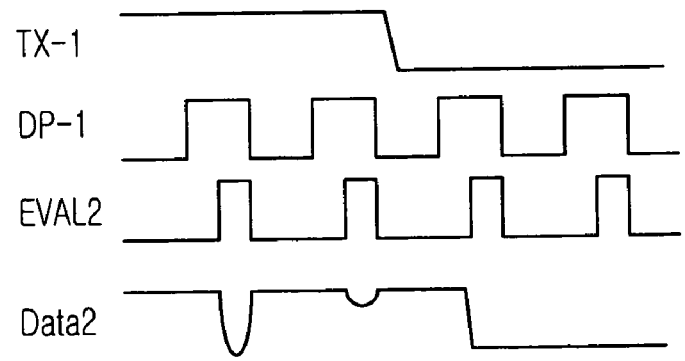
FIG. 9B is a timing diagram illustrating the normal data transmission in FIG. 8.
Figure 11:
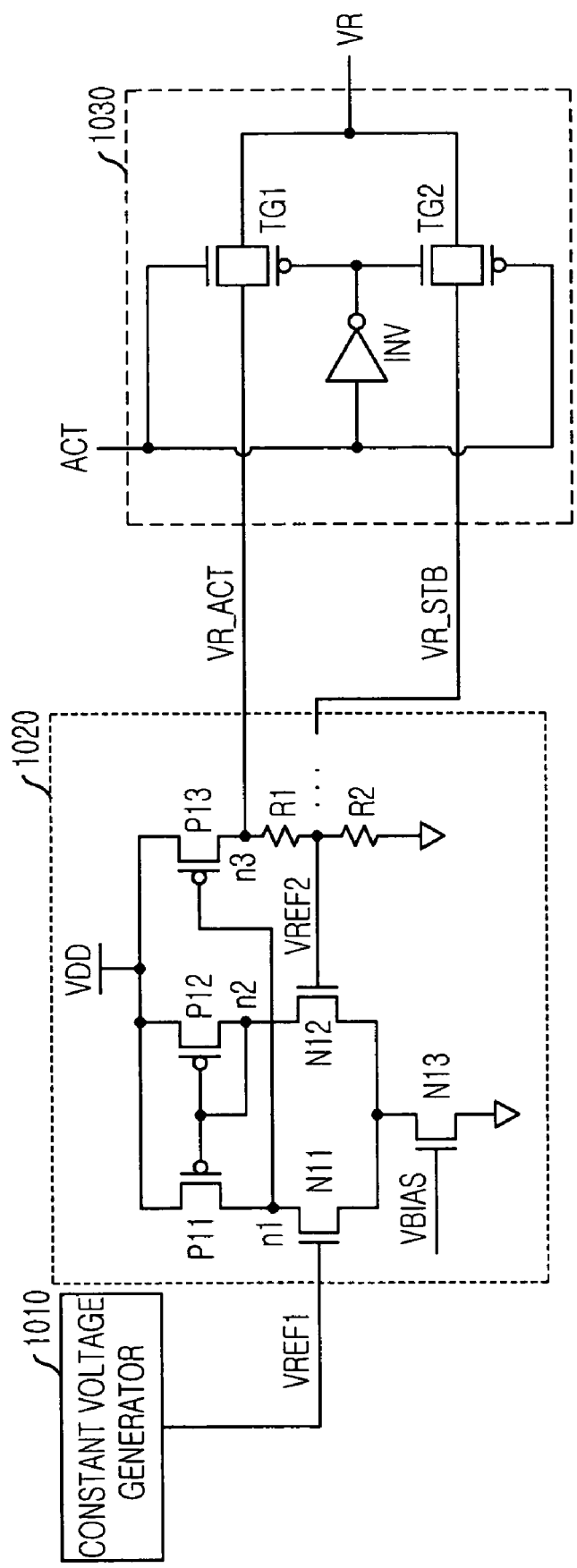
FIG. 11 is a schematic diagram illustrating a variable reference voltage generator in accordance with one embodiment of the present invention.

FIG. 11 is a schematic diagram illustrating a variable reference voltage generator in accordance with one embodiment of the present invention. Referring to FIG. 11, the variable reference voltage generator includes: a constant voltage generator 1010 for generating a constant voltage VREF1; a level shifter 1020 for receiving the constant voltage VREF1 and for generating an active mode reference voltage VR_ACT and a standby mode reference voltage VR_STB that is lower than the active mode reference voltage VR_ACT; and a multiplexer 1030 for selectively outputting the active mode reference voltage VR_ACT or the standby mode reference voltage VR_STB as a reference voltage VR in response to a mode information signal ACT.

The level shifter 1020 coupled to a ground voltage level VSS includes: a sink NMOS transistor N13 having a gate to which a bias voltage is applied; a differential input NMOS transistor N11 coupled between the sink NMOS transistor N13 and node n1 and having a gate to which the constant voltage VREF1 is applied; a differential input NMOS transistor N12 coupled between the sink NMOS transistor N13 and node n2 and having a gate to which a feedback reference voltage VREF2 is applied; a load PMOS transistor P11 coupled between node n1 and a power supply VDD and having a gate to which a voltage level on node n2 is applied; a load PMOS transistor P12 coupled between node n2 and the power supply VDD and having a gate to which a voltage level on node n2 is applied; a driving PMOS transistor P13 coupled between node n3 and the power supply VDD and having a gate to which a voltage level on node n1 is applied; and a voltage divider coupled between node n3 and the ground voltage level VSS and generating the feedback reference voltage VREF2.

The load PMOS transistors P11 and P12 form a current mirror. In this present invention, although the voltage divider coupled to node n3 is formed by the same resistors of two, a plurality of resistors can be used in producing different voltage levels of the standby mode reference voltage VR_STB. The standby mode reference voltage VR_STB cannot share the same node with the feedback reference voltage VREF2.

The multiplexer 1030 includes: a transmission gate TG1 for selectively outputting the active mode reference voltage VR_ACT as the reference voltage VR in response to the mode information signal ACT and an inverted mode information signal inverted by an inverter INV; and a transmission gate TG2 for selectively outputting the standby mode reference voltage VR_STB as the reference voltage VR in response to the mode information signal ACT and an inverted mode information signal inverted by an inverter INV. One of the transmission gates TG1 and TG2 is selectively turned on because they are controlled by the mode information signal ACT and the inverted signal thereof.

On the other hand, the constant voltage generator 1010 is a reference voltage generating circuit in a type of Widlar or band-gap.

Figure 12:
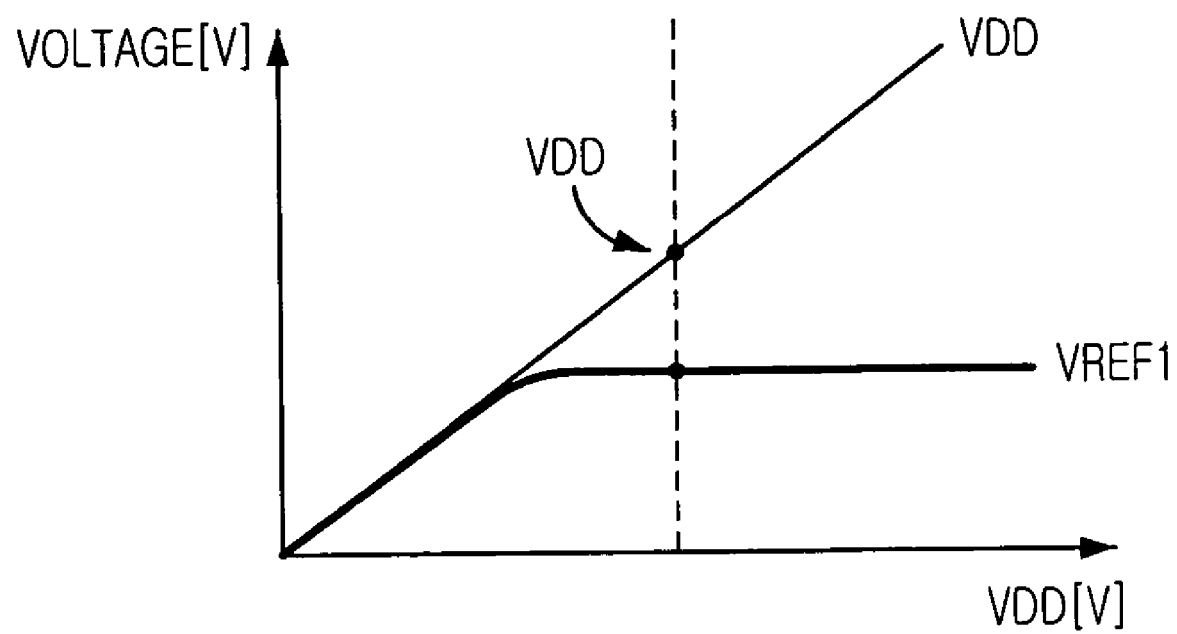
FIG. 12 is a graph illustrating a relationship between a power supply and a constant reference voltage.

FIG. 12 is a graph illustrating a relationship between the power supply VDD and the constant voltage VREF1. Referring to FIG. 12, the constant voltage VREF1, at the time of power-up, increases with the rising of the voltage level of the power supply VDD and, if the constant voltage VREF1 reaches to a specific voltage level (for example, VDD/2), it is saturated irrespective of the further rising of the power supply VDD.

Referring again to FIG. 11, when the constant voltage VREF1 is applied to the level shifter 1020, the differential input NMOS transistor N11 is turned on and node n1 is discharged. Accordingly, the driving PMOS transistor P13 is turned on and current flows into the resistors R1 and R2 with the rising of the feedback reference voltage VREF2. The channel of the driving PMOS transistor P13 is reduced by the current mirror (PMOS transistors P11 and P12) operation if the feedback reference voltage VREF2 increases and, if the feedback reference voltage VREF2 reaches to the constant voltage VREF1, the feedback reference voltage VREF2 is not increased any more. As a result, the voltage levels of the feedback reference voltage VREF2 and the constant voltage VREF1 are the same, VREF2=VREF1. At this time, current on the resistor R2 is defined as VREF2/R2 and this current is the same as that on the resistor R1. Accordingly, the active mode reference voltage VR_ACT can be expressed as follows:

$$VR\_ACT=(VREF2/R2)*(R1+R2)=VREF2*(1+(R1/R2))=VREF1*(1+(R1/R2))$$

That is, the active mode reference voltage VR_ACT is determined by both the constant voltage VREF1 and the ratio of resistance (R1/R2).

The standby mode reference voltage VR_STB is not directly related to the feedback reference voltage VREF2 and can be controlled by dividing the active mode reference voltage VR_ACT into appropriate voltage levels. Accordingly, the standby mode reference voltage VR_STB can be designed based on a voltage level which is lower than the active mode reference voltage VR_ACT.

On the other hand, if the mode information signal ACT is activated in a high voltage level, the transmission gate TG1 is turned on and the active mode reference voltage VR_ACT is outputted as the reference voltage VR. If the mode information signal ACT is nonactivated, the transmission gate TG2 is turned on and the standby mode reference voltage VR_STB is outputted as the reference voltage VR. The mode information signal ACT is a signal which is kept in a high voltage level from the beginning of a row active to an end of precharge.

The present invention prevents the low data sensing error by maintaining the high reference voltage level in the active mode in which data transmission is carried out via the global data bus line GIO and prevents the failure of the first high data by maintaining the relatively low reference voltage level in the standby mode in which data transmission is not carried out via the global data bus line GIO and by keeping the saturation GIO level low.

As illustrated above, in the present invention, the first high data failure is prevented at an initial data transmission in a multi-port memory device which has a global data bus line based on the current sensing operation. Accordingly, the reliability and operating characteristics of the memory device are further improved.

The present application is a non-provisional application of International Application No. KR 10-2004-0032651, filed May 10, 2004, the entire contents of which being incorporated herein by refrence.

Although the preferred embodiments of the invention have been disclosed for illustrative purposes, those skilled in the art will appreciate that various modifications, additions and substitutions are possible, without departing from the scope and spirit of the invention as disclosed in the accompanying claims. For example, the present invention is applicable to other RAMs including an SRAM and the numbers of ports and banks can be modified according to the capacity or chip size of the memory device. Furthermore, even though the present invention uses the NMOS transistors as the active load transistor in the receiver, it is possible to employ PMOS transistors as the active load transistor in the receiver with the corresponding modifications.

What is claimed is:

1. A multi-port memory device, comprising:
    a global data bus line including a plurality of bus lines;
    a plurality of data transmitting and receiving means including transmitters/receivers, which use a current sensing, for exchanging data into the global data bus line, wherein the receiver in the data transmitting and receiving means includes resistors for dividing a voltage level; and
    a variable reference voltage generating means for generating reference voltage levels to control current on the global data bus line by controlling the resistance of the resistors in the receiver,
    wherein the variable reference voltage generating means generates a first reference voltage level in an active mode and a second reference voltage level in a standby mode and wherein the first reference voltage level is different from the second reference voltage level in potential.

2. A multi-port memory device, comprising:
    a global data bus line including a plurality of bus lines;
    a plurality of data transmitting and receiving means including transmitters/receivers, which use a current sensing, for exchanging data into the global data bus line, wherein the receiver in the data transmitting and receiving means includes resistors for dividing a voltage level; and
    a variable reference voltage generating means for generating reference voltage levels as a receiver reference voltage, which controls current on the global data bus line, by controlling the resistance of the resistors in the receiver,
    wherein the variable reference voltage generating means generates a first reference voltage level in an active mode and generates a second reference voltage level in a standby mode and wherein the first reference voltage level is higher than the second reference voltage level.

3. The multi-port memory device as recited in claim 2, wherein the variable reference voltage generating means includes:
    a reference voltage generator for a constant reference voltage using a power supply;

a level shifter for receiving the constant reference voltage and for generating the first reference voltage level and the second reference voltage level; and a multiplexing means for selectively outputting the first reference voltage level or the second reference voltage level as the receiver reference voltage of the receivers in response to a mode information signal.

4. The multi-port memory device as recited in claim 3, wherein the level shifter is coupled to a ground voltage level and includes:

a sink NMOS transistor having a gate to which a bias voltage is applied;

a first differential input NMOS transistor coupled between the sink NMOS transistor and a first node and having a gate to which the constant voltage is applied;

a second differential input NMOS transistor coupled between the sink NMOS transistor and a second node and having a gate to which a feedback reference voltage is applied;

a first load PMOS transistor coupled between the first node and the power supply and having a gate to which a voltage level on the second node is applied;

a second load PMOS transistor coupled between the second node and the power supply and having a gate to which a voltage level on the second node is applied, wherein the first and second load PMOS transistors forms a current mirror;

a driving PMOS transistor coupled between a third node and the power supply and having a gate to which a voltage level on the first node is applied; and a voltage divider coupled between the third node and the ground voltage level and generating the feedback reference voltage, wherein the first reference voltage level is outputted by the third node and the second reference voltage level is outputted by an output terminal of the voltage divider.

5. The multi-port memory device as recited in claim 3, wherein the multiplexing means includes:

a first transmission gate for selectively outputting the first reference voltage level as the receiver reference voltage in response to the mode information signal; and a second transmission gate for selectively outputting the second reference voltage level as the receiver reference voltage in response to the mode information signal.

6. The multi-port memory device as recited in claim 3, wherein the reference voltage generator is a reference voltage generating circuit in a type of Widlar or band-gap.

7. The multi-port memory device as recited in claim 2, wherein the transmitter includes first and second NMOS transistors which are in series coupled to each other between the global data bus line and a ground voltage level and wherein first and second NMOS transistors respectively receive a data signal and a data driving pulse.

8. The multi-port memory device as recited in claim 7, wherein the receiver includes:

a first PMOS transistor in which a source is coupled to voltage supply and a drain and a gate are diode-coupled to each other;

a second PMOS transistor in which a source is coupled to voltage supply and a drain is coupled to an output node;

a first NMOS transistor in which a source is coupled to the drain of the first PMOS transistor, a drain is coupled to the global data bus line, and a reference voltage is applied to a gate;

a second NMOS transistor in which a source is coupled to the drain of the second PMOS transistor and a reference voltage is applied to a gate; and a third NMOS transistor, in which a source is coupled to a drain of the second NMOS transistor, a drain is coupled to the ground voltage level, and a data evaluation signal is applied to a gate.

9. A multi-port memory device, comprising:

a variable reference voltage generating means for generating a plurality of reference voltage levels, wherein the variable reference voltage generating means includes:

a constant voltage generating means for providing a constant voltage;

a current mirror receiving the constant voltage;

a voltage divider coupled to the current mirror for generating the plurality of reference voltage levels; and a multiplexer for selectively outputting one of the reference voltage levels in response to a mode information signal, wherein the voltage divider is driven by an output signal of the current mirror and a voltage level from the voltage divider is provided for the current mirror.

10. The multi-port memory device as recited in claim 9, wherein the multiplexer includes a plurality of transmission gates for selectively outputting one of the reference voltage levels in response to the mode information signal.

11. The multi-port memory device as recited in claim 10, wherein the variable reference voltage generator is a reference voltage generating circuit in one of a Widlar and a band-gap circuit.

* * * * *